(12) United States Patent
Bender

(10) Patent No.: US 9,793,177 B2
(45) Date of Patent: Oct. 17, 2017

(54) PRECISE ANNEALING OF FOCAL PLANE ARRAYS FOR OPTICAL DETECTION

(71) Applicant: National Technology & Engineering Solutions of Sandia, LLC, Albuquerque, NM (US)

(72) Inventor: Daniel A. Bender, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 14/824,621

(22) Filed: Aug. 12, 2015

(65) Prior Publication Data

US 2015/0348853 A1  Dec. 3, 2015

Related U.S. Application Data

(62) Division of application No. 13/956,868, filed on Aug. 1, 2013, now Pat. No. 9,142,465.

(60) Provisional application No. 61/780,387, filed on Mar. 13, 2013.

(51) Int. Cl.
| | |
|---|---|
| *H01L 21/00* | (2006.01) |
| *C03B 9/41* | (2006.01) |
| *H01L 21/66* | (2006.01) |
| *B23K 26/00* | (2014.01) |
| *H01L 27/146* | (2006.01) |

(52) U.S. Cl.
CPC .......... *H01L 22/12* (2013.01); *B23K 26/0081* (2013.01); *H01L 22/20* (2013.01); *H01L 27/14649* (2013.01); *H01L 27/14698* (2013.01); *H01L 22/14* (2013.01)

(58) Field of Classification Search
CPC ................................................. H01L 21/14698
USPC ............................................................. 438/4
See application file for complete search history.

(56) References Cited

U.S. PATENT DOCUMENTS

| | | | |
|---|---|---|---|
| 5,146,303 A | | 9/1992 | Kornrumpf et al. |
| 5,512,750 A | * | 4/1996 | Yanka ............... H01L 27/14643 250/332 |
| 5,840,592 A | | 11/1998 | Russell et al. |
| 5,991,002 A | * | 11/1999 | Kato ..................... G02F 1/1309 349/158 |
| 6,001,715 A | | 12/1999 | Manka et al. |
| (Continued) | | | |

FOREIGN PATENT DOCUMENTS

| | | | |
|---|---|---|---|
| JP | 1 0303405 A | | 11/1998 |
| JP | 10303405 A | * | 11/1998 |

OTHER PUBLICATIONS

Yan et al., "Response of machining-damaged single-crystalline silicon wafers to nanosecond pulsed laser irradiation", Sci. Technol. 22 (2007) 392-395. Semicond.

*Primary Examiner* — Igwe U Anya

(74) *Attorney, Agent, or Firm* — Medley, Behrens & Lewis, LLC

(57) ABSTRACT

Precise annealing of identified defective regions of a Focal Plane Array ("FPA") (e.g., exclusive of non-defective regions of the FPA) facilitates removal of defects from an FPA that has been hybridized and/or packaged with readout electronics. Radiation is optionally applied under operating conditions, such as under cryogenic temperatures, such that performance of an FPA can be evaluated before, during, and after annealing without requiring thermal cycling.

14 Claims, 9 Drawing Sheets

(56) References Cited

U.S. PATENT DOCUMENTS

| | | | |
|---|---|---|---|
| 6,031,231 A | | 2/2000 | Kimata et al. |
| 6,274,869 B1 | * | 8/2001 | Butler ................... G01J 5/061 |
| | | | 250/252.1 |
| 6,675,600 B1 | * | 1/2004 | Robillard ............... G01J 5/061 |
| | | | 165/81 |
| 8,189,050 B1 | | 5/2012 | Hughes et al. |
| 8,780,420 B1 | * | 7/2014 | Bluzer ................... H04N 1/04 |
| | | | 358/474 |
| 9,123,607 B1 | * | 9/2015 | Hatcher ............ H01L 27/14634 |
| 2003/0102432 A1 | | 6/2003 | Boieriu et al. |
| 2004/0061056 A1 | | 4/2004 | Barton et al. |
| 2004/0096125 A1 | | 5/2004 | Alderson et al. |
| 2006/0038128 A1 | | 2/2006 | D'Souza et al. |
| 2007/0014949 A1 | | 1/2007 | Bhatnagar et al. |
| 2007/0176082 A1 | * | 8/2007 | Lee ........................ G01J 1/04 |
| | | | 250/214 R |
| 2009/0309623 A1 | | 12/2009 | Holland et al. |
| 2010/0074515 A1 | | 3/2010 | Zhao et al. |
| 2010/0226495 A1 | | 9/2010 | Kelly et al. |
| 2011/0310275 A1 | | 12/2011 | Powell et al. |
| 2012/0051378 A1 | | 3/2012 | Kar et al. |
| 2012/0077408 A1 | | 3/2012 | Tajima |
| 2012/0228496 A1 | * | 9/2012 | Ogata ............... H01L 27/14687 |
| | | | 250/332 |
| 2012/0264254 A1 | | 10/2012 | Wan |
| 2012/0285923 A1 | * | 11/2012 | Hampp ................. B08B 7/0057 |
| | | | 216/13 |
| 2013/0026592 A1 | | 1/2013 | Lapadatu et al. |
| 2013/0182934 A1 | * | 7/2013 | Topfer ..................... G06K 9/38 |
| | | | 382/132 |
| 2014/0132774 A1 | | 5/2014 | Schmidt et al. |

\* cited by examiner

PRECISE ANNEALING OF FOCAL PLANE ARRAYS FOR OPTICAL DETECTION

RELATED APPLICATION

This application is a divisional of and claims priority to U.S. Non-Provisional application Ser. No. 13/956,868, filed on Aug. 1, 2013, and entitled "PRECISE LASER ANNEALING OF FOCAL PLANE ARRAYS FOR OPTICAL DETECTION" and claims the benefit of U.S. Provisional Application No. 61/780,387, filed on Mar. 13, 2013, and entitled "PRECISE LASER ANNEALING OF FOCAL PLANE ARRAYS FOR OPTICAL DETECTION", the entirety of which is incorporated herein by reference.

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

The present disclosure relates generally to optical detectors. More specifically, the present disclosure relates to defects in Focal Plane Arrays ("FPAs") found in an optical system.

FPAs are detectors that have a linear or two-dimensional matrix of individual elements (e.g., pixels), and are generally used at the focus of optical systems for capturing images or video, but can also be used for other non-imaging purposes such as, for example, spectrometry, LIDAR, wavefront sensing, thermal imaging, medical imaging, as a receiver of a radio telescope, etc. Materials used to form sensory portions of an FPA are selected based upon wavelengths of light that are desirably absorbed and/or detected. The materials have respective band gaps, wherein a band gap of a material corresponds to wavelengths of light that can be absorbed and/or detected by the material. For example, a camera that desirably detects light in the visible spectrum (~380 nm to ~760 nm) may utilize an FPA comprising Silicon ("Si") or Si-based materials that have band gaps that correspond to the visible spectrum.

Defects or impurities in sensory materials can cause the FPA to comprise defective pixels, which can in turn negatively impact overall operability and performance of the FPA. Conventionally, however, defects in a sensory layer of the FPA are indiscernible until a read-out circuit is hybridized with the sensory layer (e.g., the defects are not detectable until manufacturing of the FPA is completed). Thereafter, if the FPA does not operate as expected (e.g., the FPA has too many defective pixels), the FPA is discarded. For FPAs comprising relatively inexpensive material, cost of manufacturing FPAs is relatively low. For FPAs comprising relatively expensive material, however, costs of the FPA may be relatively high. Thus, for some types of FPAs, discarding a defective FPA and manufacturing a new FPA is impractical.

SUMMARY

The following is a brief summary of subject matter that is described in greater detail herein. This summary is not intended to be limiting as to the scope of the claims.

In a general embodiment, the aspects described herein pertain to a method for manufacturing FPAs using focused (e.g., laser) annealing. In another exemplary embodiment, aspects described herein pertain to a method for repair localization of FPAs using focused annealing that can constitute a supplement to existing FPA manufacturing processes. The focused annealing methods in embodiments described herein target only defective regions of a sensory layer of the FPA (e.g., defective pixels), allowing much higher temperatures to be applied to the defective regions when compared to conventional approaches, thereby further allowing for increased yield, reduced dark current, and reduced noise in FPAs when compared to conventional FPA manufacturing/repair approaches.

With more specificity, current annealing techniques used in manufacturing are centered on dopant activation and are not localized, but are performed over the entire FPA sensor layer. Employment of focused laser annealing offers the ability to reduce noise in defective pixels after they have been manufactured and after hybridization of the FPA sensory layer with read-out electronics. Thus, the focused laser annealing methods in embodiments described herein facilitate repair of FPAs that do not meet a specified operation standard (e.g., 99% operational), rather than discarding of such FPAs. For instance, large FPA development costs typically run in the $2 M-$30 M range.

In another exemplary embodiment, aspects described herein pertain to methods of reducing dark current in FPA pixels. Implementation of techniques to reduce dark current on detectors offers potential deep impact to the quality of data gathered and processed by the detectors. In an embodiment, such techniques can precisely target pixels or clusters of pixels that are "hot" or noisy, while leaving functional pixels untouched. Lowering FPA noise can be accomplished via laser annealing, where problematic pixels are targeted and a localized amount of heat is generated locally at the problematic pixels, allowing such pixels to reform under the conditions of a thermal anneal without affecting surrounding detector areas or a readout integrated circuit ("ROIC") coupled to the detector material.

In yet another exemplary embodiment, aspects described herein pertain to a method of manufacturing an FPA and/or enhancing the manufacturing thereof. In accordance with such method, a laser can be provided to anneal (e.g., by irradiation) one or more targeted defective pixels on an FPA.

In still yet another exemplary embodiment, aspects described herein pertain to a method of annealing pixels on an FPA, where a laser (e.g., laser beam) is applied to anneal (e.g., by irradiation) one or more targeted defective pixels on an FPA.

In another exemplary embodiment, aspects described herein pertain to a system for manufacturing an FPA, where the system comprises a device for positioning an FPA and a laser emitter configured to apply a laser beam to anneal one or more defective pixels of the FPA.

In yet another exemplary embodiment, aspects described herein pertain to a system for annealing pixels on an FPA, where the system comprises a device for positioning an FPA and a laser emitter configured to apply a laser beam to anneal one or more defective pixels of the FPA.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
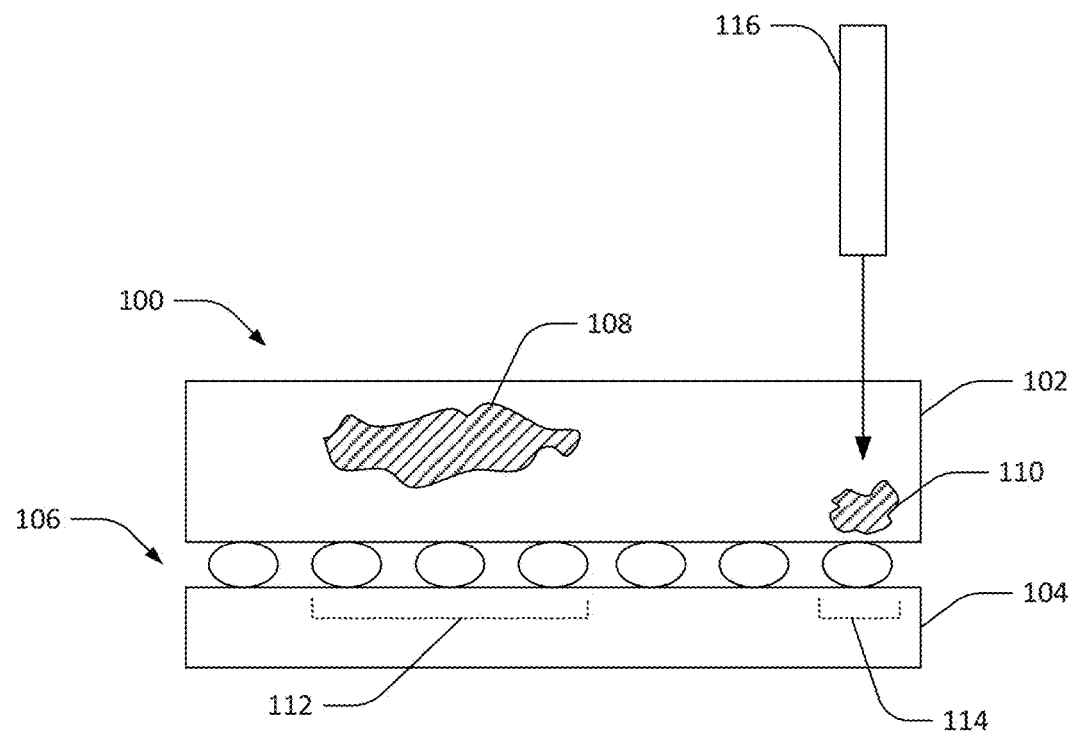
FIG. 1 is a cross-section view of an exemplary embodiment of a hybridized FPA.

Various technologies pertaining to precise annealing of FPAs are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

The articles "a," "an," and "the" should be interpreted to mean "one or more" unless the context clearly indicates the contrary. The terms "includes" or "including" is used interchangeably with the terms "comprises" or "comprising." Additionally, as used herein, the term "exemplary" is intended to mean serving as an illustration or example of something, and is not intended to indicate a preference.

In alternative embodiments, aspects described herein pertain to precise annealing of an identified defective region of an FPA. Precise annealing can improve performance of pixels in the defective region without annealing and/or potentially damaging pixels in non-defective regions of the FPA. Further, precise annealing can be applied to FPAs that have been hybridized with readout electronics (e.g., a ROIC).

With reference now to FIG. 1, a cross-sectional view of an exemplary FPA 100 is illustrated. The FPA 100 comprises a sensory layer 102. The sensory layer 102 comprises sensory material(s), wherein the sensory materials are configured to absorb radiation (e.g., light) and convert such radiation into an electric signal. In an exemplary embodiment, the sensory layer 102 can be an infrared ("IR") sensory layer that is configured to detect light in the IR spectrum. Accordingly, the sensory layer 102 can be composed of materials such as, but not limited to, HgCdTe, InSb, CdTe, GaInAs, combinations thereof, etc. In another exemplary embodiment, the sensory layer 102 can be configured to detect light in the visible spectrum, such that the sensory layer 102 can be composed of materials such as, but not limited to, Si. It is further to be understood that the sensory layer 102 can be configured to detect radiation having wavelengths differing from wavelengths of visible and IR light. The FPA 100 further comprises a ROIC layer 104 that is hybridized with the sensory layer 102. The ROIC layer 104 receives electric signals from the sensory layer 102, and converts the signals into signals that are readably processed by a computer processor, an application-specific integrated circuit ("ASIC"), a field-programmable gate array ("FPGA"), etc.

In an exemplary embodiment, the ROIC layer 104 comprises an integrated circuit chip such as, for example, a multiplexer. In another exemplary embodiment, the ROIC layer 104 is fabricated with Si-based materials using Si processing techniques, although other materials and processes are also contemplated. In yet another exemplary embodiment, prior to being hybridized, the ROIC layer 104 is tested in order to generate a ROIC baseline map that can be used to calibrate the ROIC layer 104.

The FPA further comprises a contact layer 106, wherein the sensory layer 102 is hybridized with the ROIC layer 104 by way of the contact layer 106. The contact layer 106 comprises conductive contacts, which can comprise bump bonds, conductive films or tapes, solder, etc. Contact points of the contact layer 106 are configured to transmit the electric signals from the sensory layer 102 to the ROIC layer 104, wherein receipt of an electric signal at the ROIC layer 104 from a particular contact bump corresponds to a detection response for a pixel corresponding to the contact bump.

The ROIC layer 104 can be interrogated in order to identify defective regions of the sensory layer 102. For example, a hybridized FPA can be examined in a dark (e.g., un-illuminated) condition, whereby response of a pixel (e.g., dark current responses) can be considered to be due to a defect. The exemplary sensor layer 102 is shown as having defects 108 and 110. Defects that can negatively impact the performance of the FPA can include defects resulting from a crystal dislocation in sensory material, defects at a PN junction in the sensory material, sensory material impurities, defects due to wear and tear, defects due to adversarial damage, etc.

Accordingly, interrogation of the ROIC layer 104 (e.g., reading out values from the ROIC layer 104) can be used to identify defective regions 112 and 114 of the FPA that correspond, respectively, to the defects 108 and 110. As shown, the defects 108 and 110 can occur at varying locations and depths in the sensory layer 102, and can be of varying sizes. For instance, a defect in the sensory layer 102 can be relatively small, such that a corresponding defective region has a size that is less than size of a single pixel (e.g., the defective region 114). In another example, a defect in the sensory layer 102 may be somewhat larger, such that a corresponding defective region has a size that is larger than a single pixel (e.g., the defective region 112). Generally, detection of defects is difficult/impractical until after the sensory layer 102 and ROIC layer 104 have been hybridized. This limits the applicability of repair techniques to those that can be conducted without damaging the ROIC layer 104.

For example, types of thermal annealing generally used in FPA manufacturing processes, such as to facilitate dopant activation, thermal oxidation, metal reflow, chemical vapor deposition, or other processes, use annealing temperatures that would damage the ROIC layer 104 and/or other electronics packaged with the FPA 100. Such processes generally involve heating a wafer of material to an annealing temperature by using a general heating device such as heat lamp, hot plate, furnace, or laser swept over an entirety of a wafer from which the sensory layer 102 is formed.

A further consideration is that many IR FPAs are configured to operate in cryogenic temperatures. Accordingly, in order to read out electric response values from the ROIC layer 104, and thus detect the presence of defective pixels after hybridization, an IR FPA is cooled to cryogenic temperatures. Such cooling requirements for operation can impose further limitations on applicable repair techniques. For example, even if a general heating device can raise sensory material in the sensory layer 102 of the FPA 100 to annealing temperatures without damaging the hybridized and/or packaged electronics, such heating means that the FPA 100 cannot be analyzed for defects in the sensory layer 102 until it is re-cooled to its cryogenic operating temperatures. This process of thermal cycling can take hours or days, and several of such cycles may be necessary before an FPA has achieved operational performance.

Conventional repair techniques are generally inapplicable or costly and time consuming to perform, and are further limited by temperature tolerances of other portions of the FPA 100. In accordance with aspects described herein, precise (focused) annealing of identified defective regions without annealing surrounding non-defective regions can be used to repair defects of a hybridized FPA without damaging the ROIC layer 104, can be performed without removing the FPA 100 from thermal vacuum, and can be used to increase yield, decrease cost of manufacturing FPAs, and can be used to decrease time needed to manufacture FPAs.

To that end, an emitter 116 can be configured to perform precise annealing with respect to defective regions in the sensory layer 102 of the FPA 100, where a defective region corresponds to at least one defective pixel, and the defective region is less than an entirety of the FPA 100. In an exemplary embodiment, the emitter 116 is configured to direct focused radiation to a defect (e.g., the defect 110) in the sensory layer 102, causing temperature to be locally increased (e.g., to annealing temperature of the sensory material) at the location of the defect 110, while temperature of the remainder of the sensory layer 102 remains below the annealing temperature of the sensory material. Pursuant to an example, the emitter 116 can be a laser that is configured to direct a laser beam at the defect 110, such that an exothermic reaction occurs at the defect 110 (thereby raising the temperature to reach/exceed the annealing temperature of the sensory material). In another example, the emitter 116 can be a focused ultrasound emitter that is configured to direct acoustical energy towards at least one defect in the sensory layer 102, thereby locally increasing temperature of sensory material in the sensory layer 102 at and proximate to the at least one defect. Other types of emitters are also contemplated. As will be described in greater detail herein, characteristics of radiation emitted by the emitter 116, such as fluence, magnitude, frequency, focal spot size, etc., can be selected based upon the sensory material of the sensory layer 102, depth of the PN junction in the sensory material, size of the defect, etc.

Figure 2:
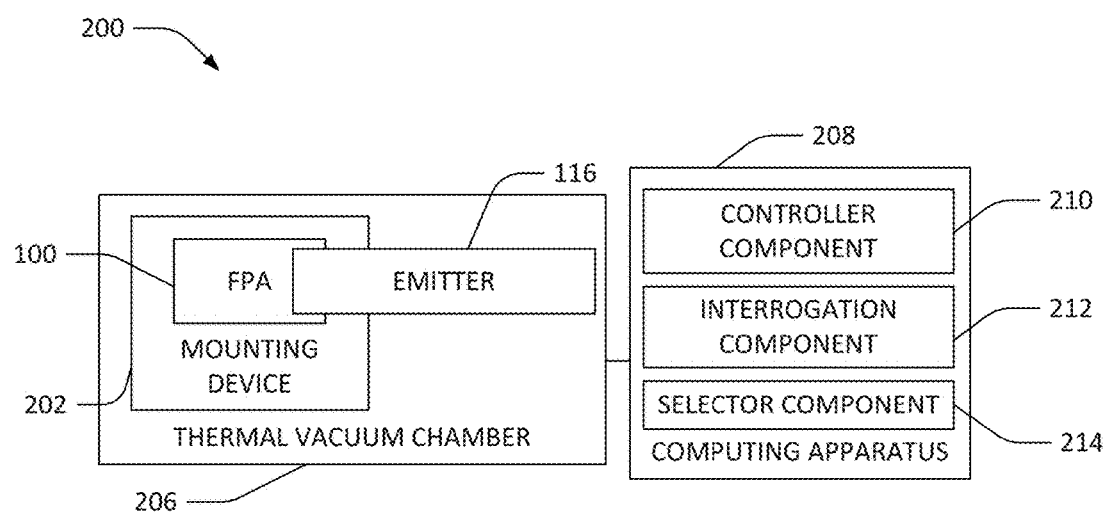
FIG. 2 is a functional block diagram of an exemplary system that facilitates precise annealing of an FPA.

With reference now to FIG. 2, a system 200 that facilitates precise annealing of the FPA 100 is illustrated. The system 200 comprises the emitter 116 and a mounting device 202 configured to receive the FPA 100. In an exemplary embodiment, the mounting device 202 and the emitter 116 are disposed inside a thermal vacuum chamber 206, which is configured to maintain cryogenic temperatures. In another example, the emitter 116 can be positioned external to the thermal vacuum chamber 206, and can be configured to emit radiation through an optical window of the thermal vacuum chamber 206.

In an exemplary embodiment, the mounting device 202 can be a translation stage that is configured to translate the FPA 100 relative to the emitter 116. In another exemplary embodiment, the mounting device 202 can be a static mount, and the emitter 116 can be configured to move relative to the FPA 100. In yet another exemplary embodiment, the mounting device 202 can be a translation stage and the emitter 116 can also be configured to be moveable.

The system 200 optionally comprises a computing apparatus 208 that comprises a controller component 210. For instance, the controller component 210 can control the movement of the mounting device 202 and/or the emitter 116. Further, the controller component 210 can control operation of the thermal vacuum chamber 206 and/or operation of the emitter 116. As indicated above, the controller component 210 can control operation of the emitter 116 such that the emitter 116 focuses radiation towards a defective region in the sensory layer 102 of the FPA 100, and further causes such radiation to have particular characteristics, which may be a function of distance between the emitter 116 and the sensory layer 102 of the FPA 100, thickness of the sensory material, type of the sensory material, depth of the PN junction in the sensory material at the defect, ambient temperature, humidity, etc. For instance, the computing apparatus 208 can receive an indication of type of the sensory material, thickness of the sensory material, etc. from an operator of the system 200. Selection of a type of emitter and computation of the aforementioned radiation characteristics are described in greater detail below.

The computing apparatus 208 can further optionally include an interrogation component 212 that is employable in connection with identifying location of at least one defect in the sensory layer of the FPA 100. The interrogation component 212 is in communication with the ROIC layer 104 of the FPA 100. The interrogation component 212 reads electric response signals from the ROIC layer 104 of the FPA 100. By reading such electric response signals when the FPA 100 is under a dark condition, defective pixels (e.g., those with high dark current responses) can be identified. Electric response signals can also be read under other lighting conditions in order to evaluate performance characteristics of the FPA 100.

The computing apparatus 208 also optionally comprises a selector component 214 that can select, for example, the emitter 116 from amongst a plurality of potential emitters. For example, various lasers having different respective operating properties may be available for precisely annealing sensory layers of FPAs, wherein a desirably employed laser from the various lasers can be selected by the selector component 214 based upon the operating properties of the laser (e.g., range of fluence, wavelength of radiation that can be emitted by the laser, etc.), type of sensory material that is to be subjected to annealing, depth of a defect, etc. In an exemplary embodiment, the selector component 214 can select the emitter 116 from amongst lasers, focused ultrasound emitters, focused light emitters, etc. Further, the selector component 214 may select a combination of emitters.

Further, the selector component 214 can select characteristics of radiation emitted by the emitter 116 based at least in part upon a thermal model corresponding to the sensory material. The thermal model can be used to simulate radiation absorption of the sensory material and model heat profile generation when the sensory material is irradiated. The selector component 214 can estimate fluence (e.g., energy per unit area), wavelength, etc., needed to melt sensory material(s) of the sensory layer 102 of the FPA 100 at a desired depth therein. For example, the selector component 214 can determine an amount of fluence needed to anneal the sensory material in the sensory layer 102 (e.g., wherein the estimate is based upon the thermal model).

The controller component 208 can receive radiation characteristics for annealing the sensory material in the sensory layer 102 from the selector component 114, and can control the emitter 116 such that the emitter locally irradiates identified defective regions of the sensory layer 102 of the FPA 100 using the radiation characteristics. Annealing in such fashion allows for the defective regions to be annealed without negatively impacting non-defective regions of the sensory layer 102 or the ROIC layer 104 of the FPA 100. With more particularity, to repair defects in a defective region corresponding to at least one defective pixel, the controller component 208 can control the emitter 116 such that radiation emitted thereby is absorbed by the sensory material at a region proximate to a PN junction in such material (e.g., as defects typically occur proximate to such PN-junction). Thus, the emitter 116 can be controlled to emit focused radiation with a fluence and wavelength (for example) that causes such radiation to be absorbed at a depth of the sensory layer 102 corresponding to the PN junction therein, and further causes temperature at the defective region to reach an annealing temperature of the sensory material (without damaging the sensory layer 102 and/or annealing properly operating regions of the sensory layer 102). Responsive to being irradiated, the defective region melts (e.g., becomes included in a melted region), and upon cooling, the melted region begins epitaxial regrowth, as described in more detail below. Thus, not only can defective regions in the FPA 100 be annealed without damaging electronics packaged with the FPA 100 (the ROIC layer 104, electronic connections, casing, etc.), but also the defective regions can be annealed without removing the FPA 100 from cryogenic temperatures or disengaging the FPA from communication with the computing device 208.

Because cryogenic temperatures can be maintained during annealing, effectiveness of the annealing can be ascertained relatively quickly (e.g., in real-time). For instance, the interrogation component 212 can be configured to interrogate the ROIC layer 104 of the FPA 100 during and/or after the emitter 116 locally irradiates a defective region (e.g., in order to gage a performance change in the defective region). Such feedback can be used in successive cycles of annealing, and can reduce processing time and costs, and raise manufacturing yields.

The controller component 210 can also control the emitter 116 to cause radiation emitted thereby to have a particular focal spot size, pulse energy, spatial-temporal profile, etc. Focal spot size, pulse energy, spatial-temporal profile, etc., can relate to sensory material in the sensory layer 102, wavelength of radiation emitted by the emitter 116, etc. Moreover, the controller component 210 can utilize an optical parametric oscillator to control depth where radiation emitted by the emitter 116 is absorbed in the sensory material.

For example, as the defective region of the FPA 100 is irradiated, and the sensory material at the defective region is melted, absorption and heat profile generation properties of the defective region may change. Thus, properties of radiation applied to such defective region may likewise change. Additionally, depth of the PN junction of the sensory material may vary in the FPA 100 (e.g., depending on the selection and/or arrangement of sensory materials). The emitter 116 desirably emits radiation at a higher energy for defects that are further from a surface of the sensory layer 102 of the FPA 100. For example, for FPAs having a relatively thick sensory layer, selecting a laser beam at or slightly below a band edge of the sensory material promotes even absorption throughout a thickness of an irradiated region.

Figure 3:
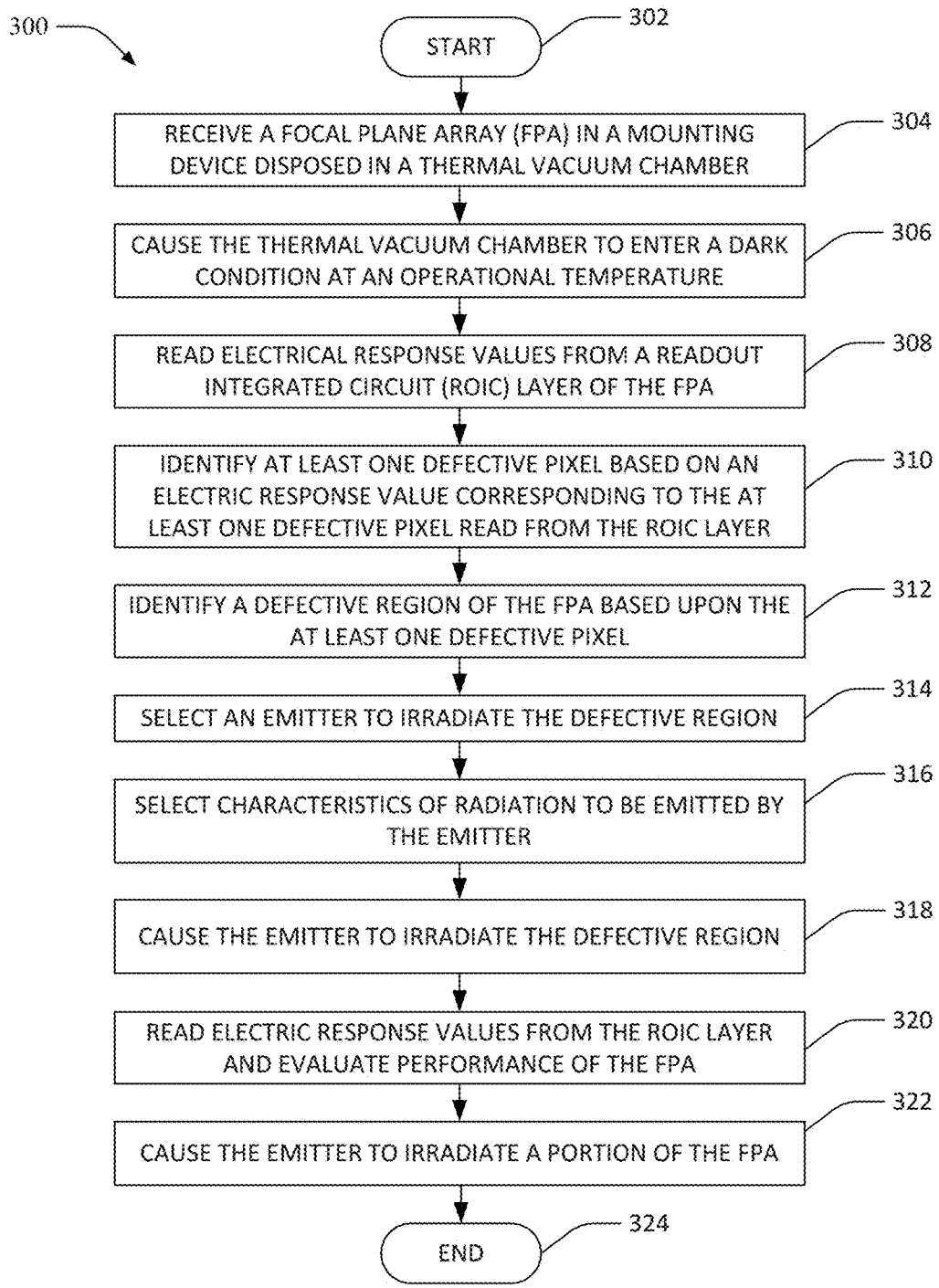
FIG. 3 is flow diagram that illustrates an exemplary methodology for precisely annealing an FPA.

FIG. 3 illustrates an exemplary methodology 300 that facilitates precise annealing of an FPA. While the methodology is shown and described as being a series of acts that are performed in a sequence, it is to be understood and appreciated that such methodology is not limited by the order of the sequence. For example, some acts can occur in a different order than what is described herein. In addition, an act can occur concurrently with another act. Further, in some instances, not all acts may be required to implement a methodology described herein.

The methodology 300 begins at 302, and at 304, an FPA is received in a mounting device disposed in a thermal vacuum chamber. The FPA is a hybridized FPA comprising a sensory layer bonded with a ROIC layer. The mounting device can be, for example, a static mount, a translational stage, etc. At 306, the thermal vacuum chamber is caused to enter a dark condition at an operational temperature. Operational temperatures may be, for example, cryogenic temperatures. In some embodiments, such as when operating temperatures are proximate to room temperature, the mounting device is not disposed in the thermal vacuum chamber.

At 308, electric response values of pixels in the FPA are read out from the ROIC layer. For instance, the values can be read out by a computing apparatus in communication with the ROIC layer. At 310, at least one defective pixel is identified based on an electric response value corresponding to at least one defective pixel and read out from the ROIC layer, and at 312, a defective region of the FPA is identified based upon the at least one defective pixel.

At 314, an emitter is selected to irradiate the defective region. The emitter may be selected automatically and/or by a user based on a thermal model of emissions from various emitters on various sensory materials. At 316, characteristics of radiation to be emitted by the emitter are selected. The characteristics may be selected automatically and/or by a user based on a size of the defective region, depth of a defect in the sensory layer of the FPA, depth of a PN junction in the sensory layer of the FPA, or other properties of the FPA. As indicated above, exemplary characteristics include wavelength of radiation, pulse energy of radiation, focus spot size, and spatial-temporal profile for the radiation. At 318, the emitter is caused to locally irradiate the defective region, without irradiating an entirety of the FPA.

At 320, electric response values are read out from the ROIC layer, and performance of the FPA is evaluated. For example, the FPA may be desired to comprise a proportion of non-defective pixels above an operational standard (e.g., >99% of the pixels in the FPA are functional). Optionally, at 322, based on the performance of the FPA, the emitter is caused to irradiate a portion of the FPA. In an example, the defective region may require additional annealing. In another example, annealing the defective region may have impacted another portion of the FPA. In another example, the FPA may comprise additional defects that are desirably repaired in order for the FPA to perform at operational standards. The methodology 300 ends at 324.

Figure 4:
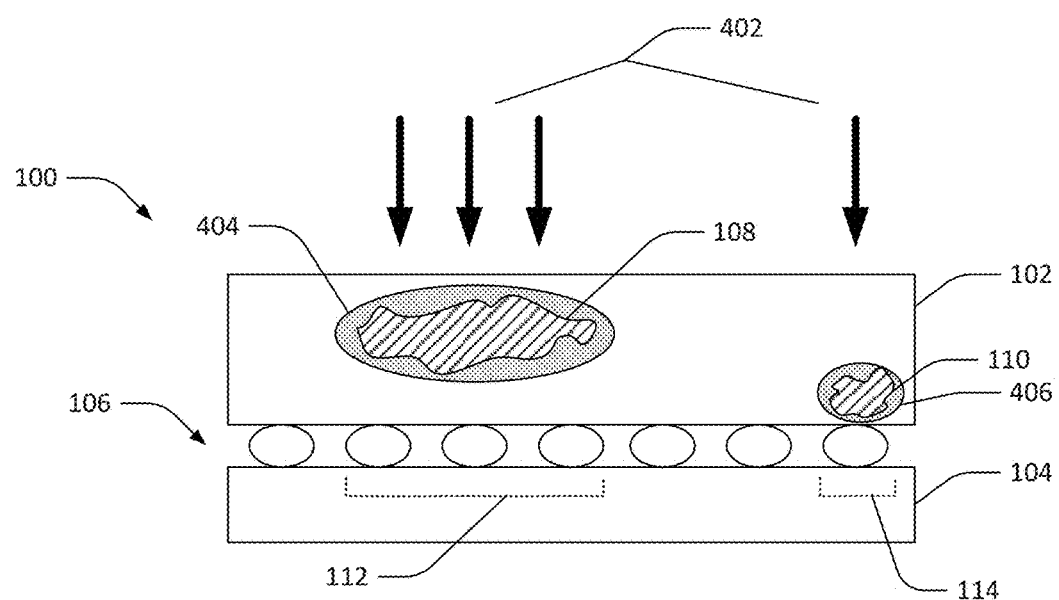
FIGS. 4-8 are cross-section views of an exemplary FPA undergoing focused annealing.

FIGS. 4-8 illustrate the FPA 100 being subjected to precise annealing in an embodiment. With reference solely to FIG. 4, the emitter 116 (not shown) directs radiation 402 at the identified defective regions 112 and 114 (respectively corresponding to the defects 108 and 110). The emitter 116 (or emitters) can emit the radiation 402 towards the defective regions 112 and 114 sequentially or simultaneously. Briefly described, the radiation 402 is of sufficient intensity to locally melt sensory material of the sensory layer 102, developing melt zones 404 and 406 around the defects 108 and 110, respectively. As illustrated in FIG. 4, the melt zones 404 and 406 are exclusive of non-defective regions of the FPA 100. For example, when irradiating the defective region 112, focus spot size, fluence, wavelength, and other properties of the radiation 402 can be selected so as to melt material local to the defect 108 without melting material of non-defective regions of the FPA 100.

Figure 5:
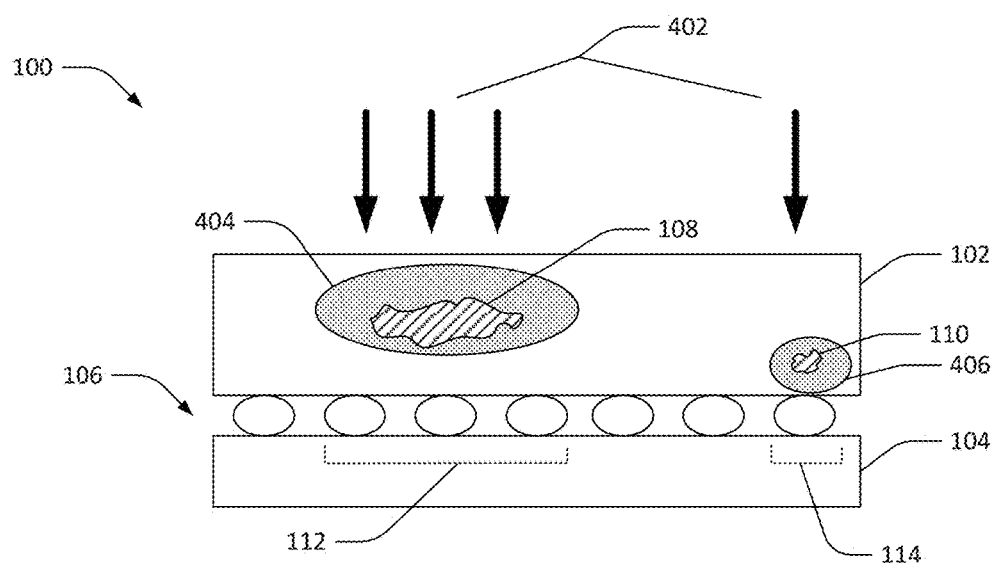
Figure 6:
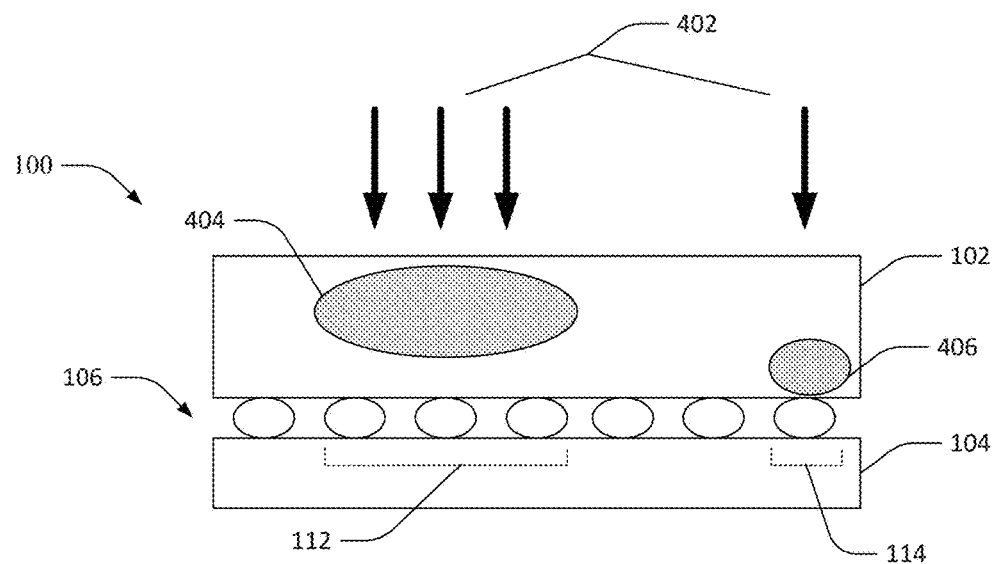

Referring now to FIG. 5, the melting of the sensory material in the melt zones 404 and 406 softens the sensory material around the defects 108 and 110, and promotes dislocation movement and lattice relaxation, exemplified by shifting and shrinking of the defects 108 and 110 in the FPA 100. As illustrated in FIG. 6, responsive to the sensory material being irradiated by the emitter 116 as described herein, the defects 108 and 110 are substantially or completely removed.

Figure 7:
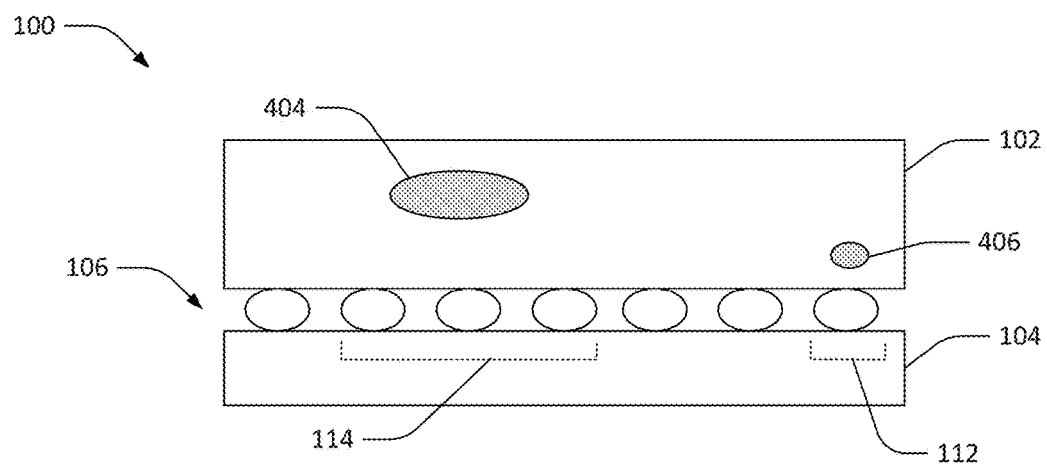
Figure 8:
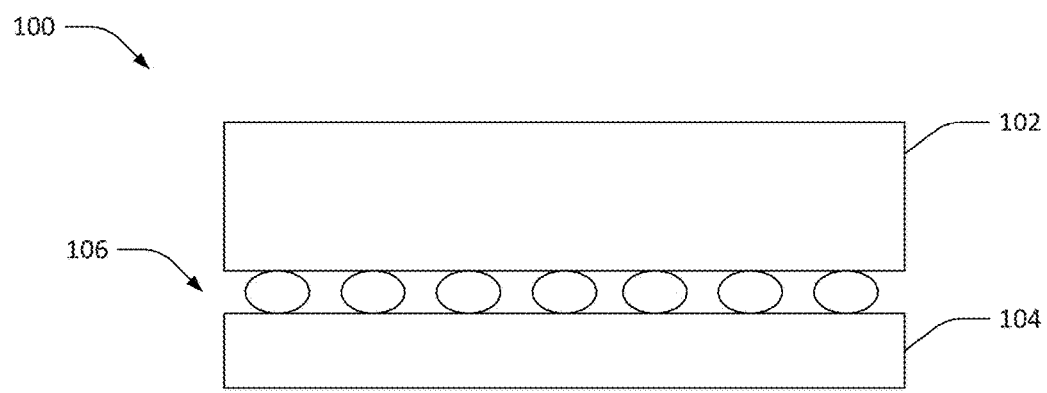

Referring now to FIG. 7, subsequent to the emitter 116 irradiating the sensory material, epitaxial regrowth begins to occur in the melt zones 404 and 406. The regrowth is epitaxial, as un-melted material surrounding the melt zones 404 and 406 serves as a seed layer on which the regrowth is based. As illustrated in FIG. 8, this epitaxial regrowth results in a substantially homogenous crystalline structure that is substantially free of dislocations and defects.

The precise annealing systems and methods described above can be used to elevate yields of FPA manufacture. Further, precise annealing can be applied retroactively to FPAs already packaged, but which fail to meet operability requirements due to excessive defects. Precise annealing can also be applied to FPAs damaged during use such as by wear-and-tear, or by adversarial damage, such as a laser directed to an FPA used in a satellite. Example 1 below illustrates repairing surface damage to an FPA.

Figure 9:
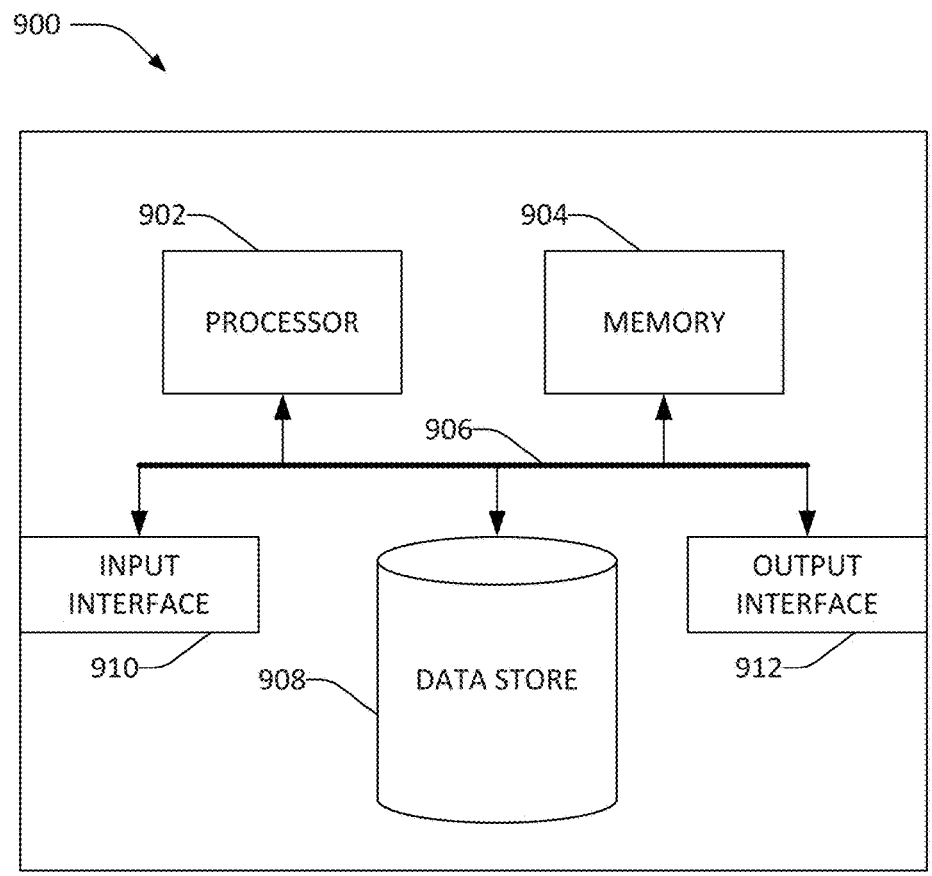
FIG. 9 is a functional block diagram of an exemplary computing apparatus.

Referring now to FIG. 9, a high-level illustration of an exemplary computing apparatus 900 that can be used in accordance with the systems and methodologies disclosed herein is illustrated. For instance, the computing apparatus 900 may be used in a system that facilitates precise annealing of an FPA. By way of another example, the computing apparatus 900 can be used in a system that identifies and/or repairs defective regions of a hybridized FPA. The computing apparatus 900 includes at least one processor 902 that executes instructions that are stored in a memory 904. The instructions may be, for instance, instructions for implementing functionality described as being carried out by one or more components discussed above or instructions for implementing one or more of the methods described above. The processor 902 may access the memory 904 by way of a system bus 906. In addition to storing executable instructions, the memory 904 may also store a graphical user interface, models, results data, etc.

The computing apparatus 900 additionally includes a data store 908 that is accessible by the processor 902 by way of the system bus 906. The data store 908 may include executable instructions, thermal models, materials properties data, electric potential values data, etc. The computing apparatus 900 also includes an input interface 910 that allows external devices to communicate with the computing apparatus 900. For instance, the input interface 910 may be used to receive instructions from an external computer device, from a user, etc. The computing apparatus 900 also includes an output interface 912 that interfaces the computing apparatus 900 with one or more external devices. For example, the computing apparatus 900 may display text, images, etc. by way of the output interface 912.

It is contemplated that the external devices that communicate with the computing apparatus 900 via the input interface 910 and the output interface 912 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing apparatus 900 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing apparatus 900 may be a distributed system. Thus, for instance, several devices may be in communication by way of a network connection and may collectively perform tasks described as being performed by the computing apparatus 900.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc ("CD"), laser disc, optical disc, digital versatile disc ("DVD"), floppy disk, and Blu-ray disc ("BD"), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionally described herein can be performed, at least in part, by one or more hardware logic components. For example, and without limitation, illustrative types of hardware logic components that can be used include Field-programmable Gate Arrays ("FPGAs"), Program-specific Integrated Circuits ("ASICs"), Program-specific Standard Products ("ASSPs"), System-on-a-chip systems ("SOCs"), Complex Programmable Logic Devices ("CPLDs"), etc.

EXAMPLES

By way of example and not limitation, the following examples are illustrative of various embodiments of aspects described herein.

Example 1—Damaging a Surface of an FPA

Figure 10:
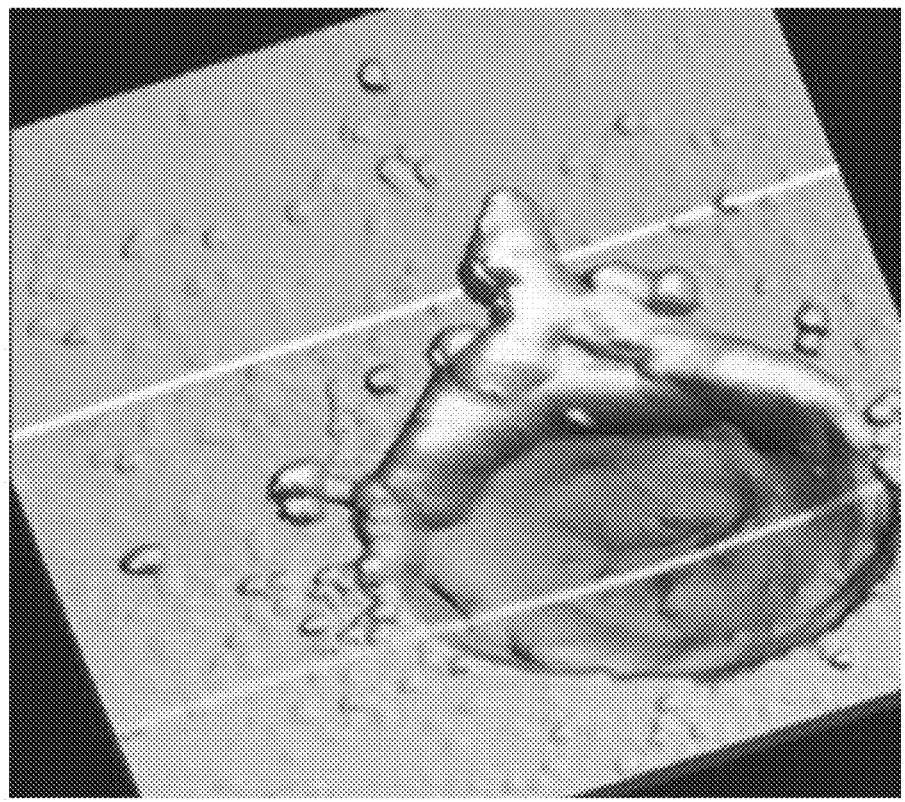
FIG. 10 is an atomic force image of an FPA with surface damage; material of Example 1.

FIG. 10 is an atomic force image depicting surface damage on a silicon photodiode. The silicon photodiode was intentionally damaged by shining a high energy Q-switch laser pulse onto an active area of the photodiode with a fluence level of 2.2-2.6 J/cm$^2$; above a damage threshold of silicon. Such a pulse would be indicative of adversarial damage, but in this experiment, served as a means of creating a region of defects and dislocations approximately the same size as a pixel. Such damage mimics defects and dislocations present in manufactured IR FPAs.

Figure 11:
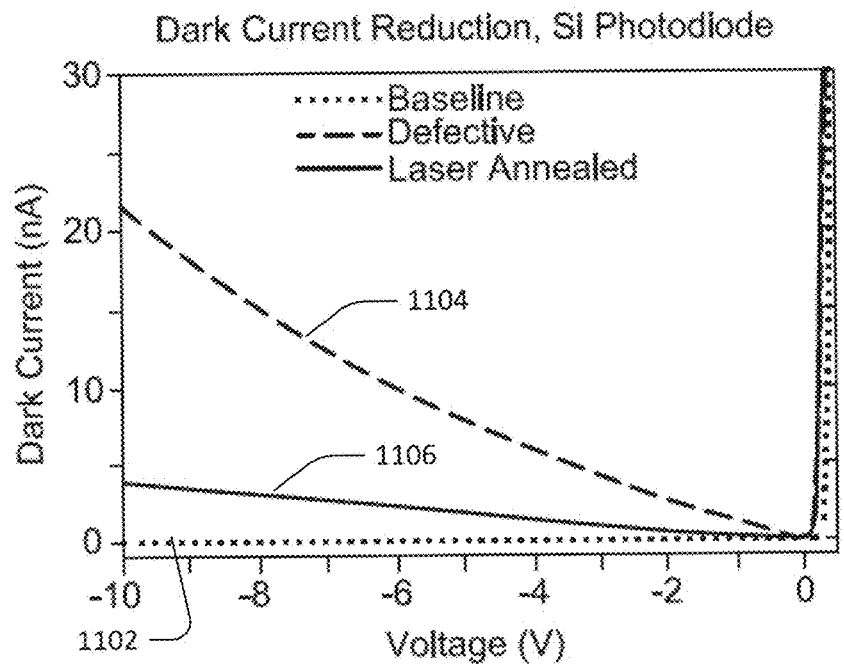
FIG. 11 is a graph of dark current electrical response of the FPA vs. reverse bias voltage before being damaged, after being damaged, and after being annealed; material of Examples 1 and 2.
Figure 12:
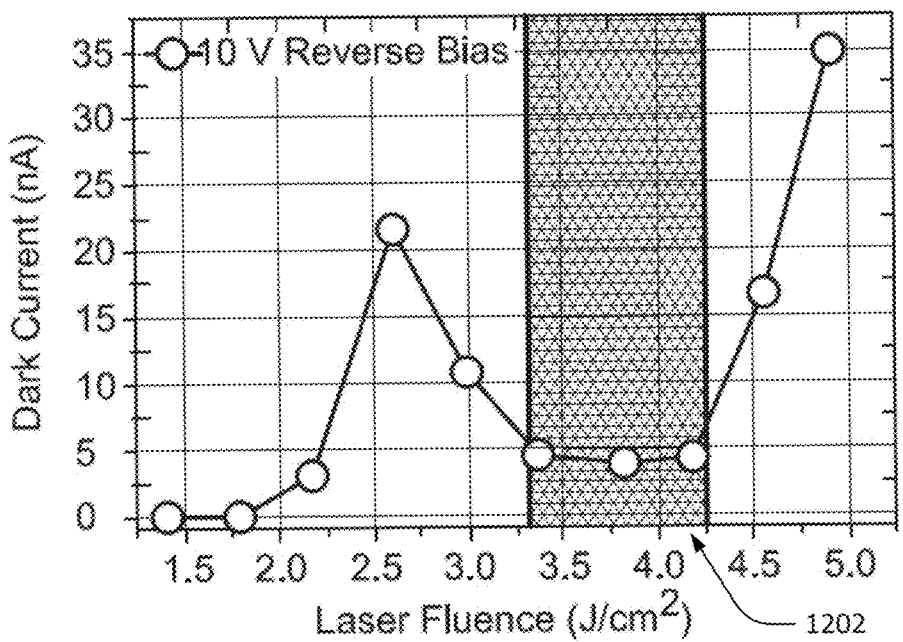
FIG. 12 is a graph of dark current electrical response of the FPA vs. applied laser fluence; material of Examples 1-3.

Morphological and electrical damage to the photodiode resulted from the laser exposure. FIG. 11 is a graph illustrating dark current electrical responses of the damaged region of the photodiode before damaging (the baseline 1102), after damaging (the defective line 1104), and after annealing (the Laser Annealed line 1106). FIG. 12 is a graph illustrating dark current electrical responses at a 10 volt reverse bias of the damaged region after being subjected to laser pulses of a varying fluence (to clarify, there is no bias applied to the device during laser exposure). As illustrated by FIGS. 11 and 12, the damage increased dark current electrical response from the 0 nA baseline to over 20 nA.

Example 2—Annealing the Damaged Region of the Photodiode

As illustrated in FIG. 12, a 1064 nm laser pulse with a fluence between 3.25-4.25 J/cm$^2$ define an annealing fluence range 1202 at which defects in the FPA are repaired. A laser pulse in the annealing range was applied to the damaged region of the photodiode. As illustrated by the Laser Annealed line 1106 in FIG. 11, the dark current electrical response of the damaged region of the photodiode decreased by almost five times, and at no bias voltage did performance of the photodiode degrade or worsen.

It can be understood that the annealing fluence range may be device specific, and can differ for different sensory materials and defects. Further, other pulse parameters may be optimized based on the sensory material or other factors. While this experiment used an Si photodiode, the process is similarly applicable to other materials, such as HgCdTe, given the aforementioned variations to fluence range and pulse parameters.

Example 3—Applying High Fluences to the Damaged Region

As illustrated in FIG. 12, laser fluences above 4.25 J/cm$^2$ caused further damage to the photodiode. Too much heat generated in the defective region resulted in not only melting but also boiling, which resulted in material ejecta and possibly splatter onto neighboring regions of the photodiode. By varying amount of fluence applied to different materials, annealing fluence ranges and damage thresholds can be determined.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:
1. A system comprising:
a device configured to mount and position a Focal Plane Array ("FPA"), wherein the FPA comprises: a sensory layer and a ROIC layer, wherein the sensory layer is hybridized with the ROIC layer, wherein the sensory layer comprises an identified defective region, the defective region corresponding to at least one defective pixel, the defective region being less than an entirety of the FPA;

an emitter that irradiates the defective region of the FPA to anneal the defective region without annealing a non-defective region of the FPA; and a controller component, wherein the controller component is configured to control the movement of the emitter or to control the movement of the device configured to mount and position the FPA.

2. The system of claim 1, further comprising a thermal vacuum chamber, wherein the emitter is configured to irradiate the defective region of the FPA while under thermal vacuum.

3. The system of claim 2, wherein the device configured to mount and position the FPA and the emitter are disposed inside the thermal vacuum chamber.

4. The system of claim 1, wherein the defective region is defective due to a defect in a PN-junction within the sensor layer of the at least one defective pixel.

5. The system of claim 4, further comprising an interrogation component that:

reads values from the ROIC layer when the FPA is under a dark condition; and identifies the defective region based upon a value corresponding to the at least one defective pixel read from the ROIC layer.

6. The system of claim 1, wherein the emitter is further configured to focus a spot size of radiation emitted by the emitter to be less than the size of the at least one pixel.

7. The system of claim 1, wherein the device configured to mount and position the FPA is configured to translate the FPA relative to the emitter.

8. The system of claim 1, wherein the device configured to mount and position the FPA is static, and wherein the emitter is configured to move relative to the FPA.

9. The system of claim 1, wherein the controller component is configured to receive radiation characteristics for annealing the sensory layer.

10. The system of claim 1, further comprising an interrogation component that is configured to interrogate the ROIC layer during or after the emitter irradiates the defective region.

11. The system of claim 1, wherein the controller component is further configured to control the emitter to emit radiation with a particular focal spot size, pulse energy, or spatial-temporal profile.

12. The system of claim 1, wherein the sensory layer is hybridized with the ROIC layer by a contact layer.

13. A system comprising:

a device configured to mount and position a Focal Plane Array ("FPA"), wherein the FPA comprises: a sensory layer and a readout integrated circuit (ROIC) layer, wherein the sensory layer is hybridized with the ROIC layer, wherein the sensory layer comprises an identified defective region, the defective region corresponding to at least one defective pixel, the defective region being less than an entirety of the FPA;

a laser emitter that irradiates the defective region of the FPA to anneal the defective region without annealing a non-defective region of the FPA; and a computing apparatus comprising:

a laser selector component that selects characteristics of a laser beam to be emitted by the laser emitter based at least in part upon a thermal model that simulates laser absorption and heat profile generation within a material to be annealed; and a controller component, wherein the controller component is configured to control the movement of the emitter or to control the movement of the device configured to mount and position the FPA.

14. A system comprising:

a device configured to mount and position a Focal Plane Array ("FPA");

an emitter configured to emit annealing radiation and to focus the emitted annealing radiation onto a selected portion of a sensory layer of the FPA without annealing a non-defective region of the FPA;

an interrogation component configured to read pixel values from a readout integrated circuit (ROIC) layer of the FPA and to identify defects from the read pixel values, wherein the ROIC layer is hybridized with the sensory layer; and a controller component, wherein the controller component is configured to control the movement of the emitter or to control the movement of the device configured to mount and position the FPA.

* * * * *